(12) United States Patent
Henderson et al.

(10) Patent No.: US 8,354,300 B2
(45) Date of Patent: Jan. 15, 2013

(54) REDUCING SUSCEPTIBILITY TO ELECTROSTATIC DISCHARGE DAMAGE DURING DIE-TO-DIE BONDING FOR 3-D PACKAGED INTEGRATED CIRCUITS

(75) Inventors: Brian Matthew Henderson, Escondido, CA (US); Arvind Chandrasekaran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 524 days.

(21) Appl. No.: 12/710,586

(22) Filed: Feb. 23, 2010

(65) Prior Publication Data
US 2011/0204504 A1    Aug. 25, 2011

(51) Int. Cl.
*H01L 21/00* (2006.01)
*H01L 23/02* (2006.01)

(52) U.S. Cl. ........... 438/109; 257/686; 257/E21.614; 257/E23.177

(58) Field of Classification Search .......... 438/109, 438/FOR. 368, FOR. 426; 257/686, E23.177, 257/E21.614
See application file for complete search history.

(56) References Cited

U.S. PATENT DOCUMENTS

| | | |
|---|---|---|
| 2005/0184390 A1 | 8/2005 | Gagne et al. |
| 2006/0091507 A1* | 5/2006 | Fjelstad et al. ................ 257/676 |
| 2008/0036062 A1 | 2/2008 | Hsu |
| 2008/0230903 A1 | 9/2008 | Sato |

OTHER PUBLICATIONS

International Search Report and Written Opinion—PCT/US2011/025809—ISA/EPO—May 24, 2011.

* cited by examiner

*Primary Examiner* — Long Tran
(74) *Attorney, Agent, or Firm* — Michelle Gallardo; Nicholas J. Pauley; Jonathan T. Velasco (57) ABSTRACT

Mitigating electrostatic discharge damage when fabricating a 3-D integrated circuit package, wherein in one embodiment when a second tier die is placed in contact with a first tier die, conductive bumps near the perimeter of the second tier die that are electrically coupled to the substrate of the second tier die make contact with corresponding conductive bumps on the first tier die that are electrically coupled to the substrate of first tier die before other signal conductive bumps and power conductive bumps on the second tier and first tier dice make electrical contact.

28 Claims, 6 Drawing Sheets

REDUCING SUSCEPTIBILITY TO ELECTROSTATIC DISCHARGE DAMAGE DURING DIE-TO-DIE BONDING FOR 3-D PACKAGED INTEGRATED CIRCUITS

FIELD

The present invention relates to fabrication of electronic integrated circuit packages, and more particularly to mitigating electrostatic discharge damage during the fabrication of 3D packaged integrated circuits.

BACKGROUND

In some integrated circuit stacked die packaging, such as 3D or TSS (Through Silicon Stacking) integrated circuit packaging, two or more dice (chips) are stacked on top of each other. For example, a first tier die may be bonded to a package substrate, and a second tier die may be bonded on top of the first tier die. Conductive bumps on the bottom of the second tier die are electrically coupled to conductive bumps on the top of the first tier die. This electrical coupling may be realized by soldering. The first tier and second tier dice may be positioned relative to each other so that their active sides are facing each other. As another example, the active side of the second tier die may be on top, where through-silicon vias provide electrical connection between the active side of the second tier die and the bottom side having the conductive bumps. Additional dice may be stacked on top of the second tier die.

When bonding one die to another die, as one die first comes into electrical contact with the other die, there may be an electrostatic discharge (ESD), which may damage the integrated circuits disposed therein. Although in many applications ESD protection may be provided at the circuit level, in the case of TSS packaged integrated circuits, it is desirable to reduce or eliminate the amount of circuit level ESD protection between the different integrated circuit tiers so as not to introduce parasitic capacitances. Also, current methods to reduce the likelihood of ESD events, such as grounding a die or ionizing the surrounding air, may not be as effective in TSS packaging technology in comparison to single die integrated circuit packaging. Accordingly, it is desirable to reduce the risk of ESD damage when manufacturing TSS packaged integrated circuits without introducing additional ESD circuits.

SUMMARY

In a first embodiment, a first tier die is warped, where the first tier die has a substrate, a set of signal conductive bumps and power conductive bumps not electrically connected to the first tier die substrate, and a set of substrate conductive bumps each electrically connected to the first tier die substrate. A second tier die is placed in electrical contact with the first tier die. The second tier die has a substrate, a set of signal conductive bumps and power conductive bumps not electrically connected to the second tier die substrate, and a set of substrate conductive bumps each electrically connected to the second tier die substrate. When placing the second tier die in contact with the first tier die, the second tier die set of substrate conductive bumps makes contact with the first tier die set of substrate conductive bumps before the second tier die set of signal conductive bumps and power conductive bumps makes contact with the first tier die set of signal conductive bumps and power conductive bumps.

In a second embodiment, an integrated circuit package has a first die. The first die has a first substrate and a first surface, where the first surface has a perimeter, a first outer zone, a first intermediate zone, and a first outer zone. The first outer zone has conductive bumps, where the first outer zone contains the perimeter and has an inner boundary, where at least some of the first outer zone of conductive bumps are electrically coupled to the first substrate and none are signal conductive bumps or power conductive bumps. The first intermediate zone is contiguous and has an outer boundary coincident with the inner boundary of the first outer zone, has no signal conductive bumps or power conductive bumps, has an inner boundary. The first inner zone has conductive bumps, is contiguous, and has a boundary coincident with the inner boundary of the first intermediate zone. The union of the first outer zone, the first intermediate zone, and the first inner zone comprises the first surface.

In the second embodiment, the integrated circuit also has a second die. The second die has a second substrate and a second surface. The second surface has a second outer zone, an intermediate zone, and an outer zone. The second outer zone has conductive bumps that have a correspondence to the first outer zone of conductive bumps, where at least some of the second outer zone of conductive bumps are electrically coupled to the second substrate and none are signal conductive bumps or power conductive bumps. The second intermediate zone of conductive bumps has a correspondence to the first intermediate zone, and does not have signal conductive bumps or power conductive bumps. The second inner zone has conductive bumps with a correspondence to the first inner zone of conductive bumps.

In the second embodiment, the conductive bumps in the first outer zone are electrically coupled to their corresponding conductive bumps in the second outer zone, and the conductive bumps in the first inner zone are electrically coupled to their corresponding conductive bumps in the second inner zone.

In a third embodiment, an integrated circuit package has a first die. The first die has a first substrate and a first surface. The first surface has a perimeter, a first outer zone, a first intermediate zone, and a first outer zone. The first outer zone has conductive bumps. The first outer zone contains the perimeter and has an inner boundary. The first intermediate zone is contiguous and has an outer boundary coincident with the inner boundary of the first outer zone, has no signal conductive bumps or power conductive bumps, and has an inner boundary. The first inner zone has conductive bumps and is contiguous, has an outer boundary coincident with the inner boundary of the first intermediate zone, where at least some of the first inner zone of conductive bumps are electrically coupled to the first substrate and none are signal conductive bumps or power conductive bumps. The union of the first outer zone, the first intermediate zone, and the first inner zone comprises the first surface.

In the third embodiment, the integrated circuit package also has a second die. The second die has a second substrate and a second surface. The second surface has a second outer zone, a second intermediate zone, and a second outer zone. The second outer zone has conductive bumps with a correspondence to the first outer zone of conductive bumps. The second intermediate zone has a correspondence to the first intermediate zone, and does not have signal conductive bumps or power conductive bumps. The second inner zone has conductive bumps with a correspondence to the first inner zone of conductive bumps, where at least some of the second inner zone of conductive bumps are electrically coupled to the second substrate and none are signal conductive bumps or power conductive bumps.

In the third embodiment, the conductive bumps in the first outer zone are electrically coupled to their corresponding conductive bumps in the second outer zone, and the conductive bumps in the first inner zone are electrically coupled to their corresponding conductive bumps in the second inner zone.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Figure 1:
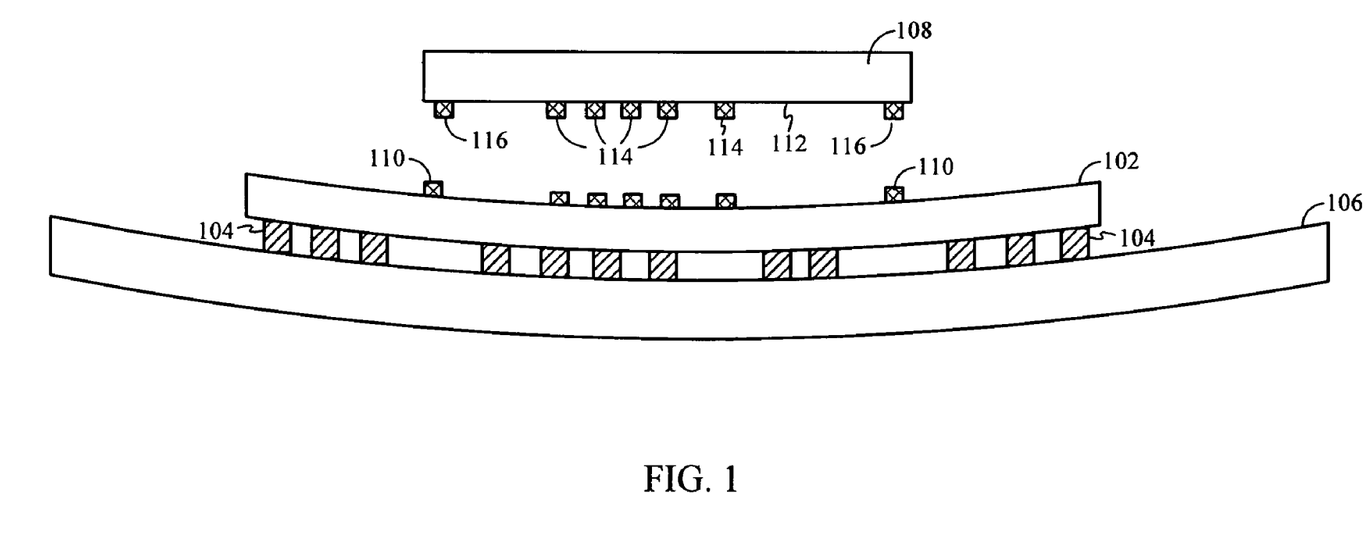
FIG. 1 illustrates a cross-sectional view of a second tier die and a warped first tier die before contact is made.

FIG. 1 is a cross sectional view (not drawn to scale) of a second tier die and a first tier die before attachment and bonding. Illustrated in FIG. 1 is a first tier die 102 having a set of conductive bumps 104 attached to a package substrate 106. For ease of illustration, not shown are under bump metallization layers for the conductive bumps 104. A second tier die 108 is to be attached to the set of conductive bumps 110 on the first tier die 102. The conductive bumps 110 may be formed on the backside of the first tier die 102. The die attaching is performed at temperatures that may cause warping of the package substrate 106 and the die 102. This warping may be exaggerated in FIG. 1.

Figure 2:
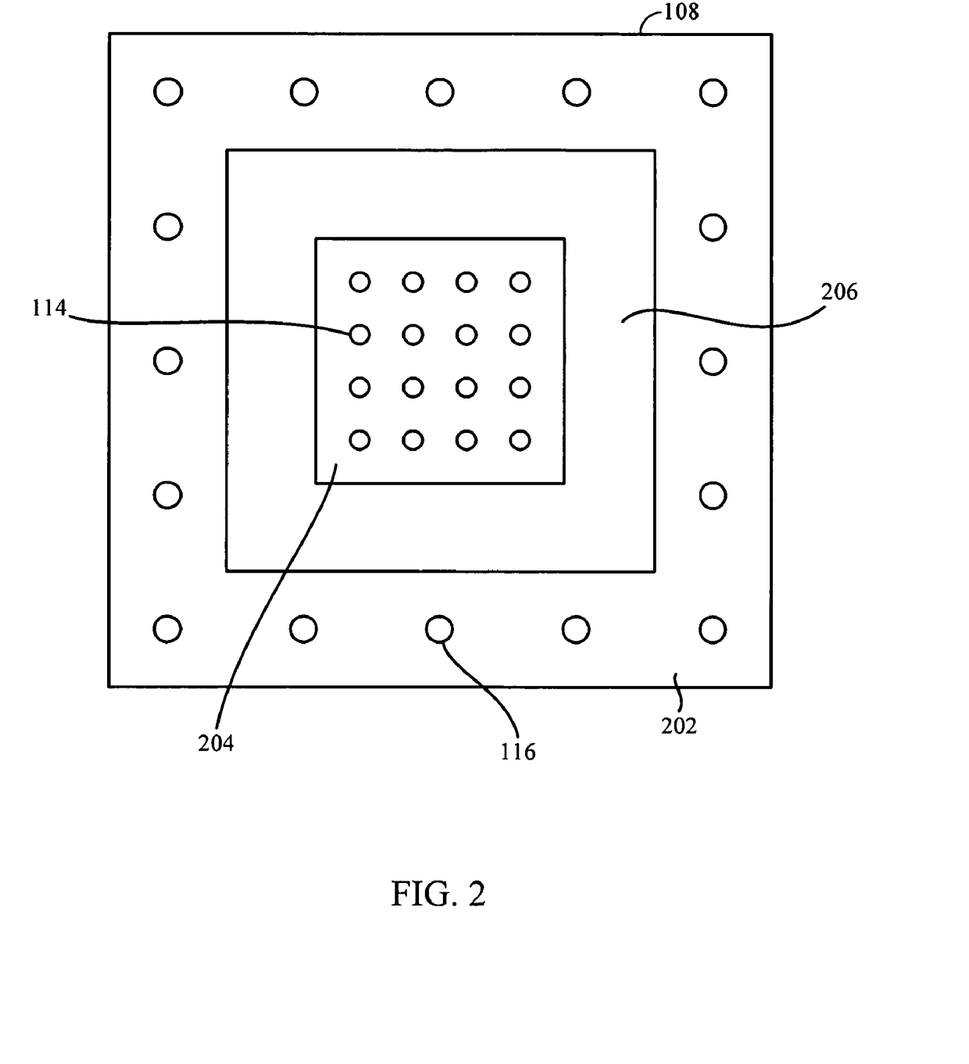
FIGS. 2 and 3 illustrate plan views of the bottom side of a second tier die.

FIG. 1 shows a set of conductive bumps on the bottom side 112 of the second tier die 108. FIG. 2 is a plan view of the bottom side 112 of the second tier die 108 showing the set of conductive bumps formed on the bottom side 112, where the set of conductive bumps is shown as a set of circles. However, for ease of illustration, the number and positions of these conductive bumps as illustrated in FIG. 2 are not the same as that illustrated in FIG. 1.

For purposes of describing the embodiments, a conductive bump on a die may be classified as a substrate conductive bump, a signal conductive bump, a power conductive bump, or a mechanical conductive bump. A substrate conductive bump is a conductive bump that is electrically coupled to the substrate, and may also be termed a $V_{SS}$ conductive bump where $V_{SS}$ denotes the die substrate voltage. A signal conductive bump is a conductive bump that is electrically coupled to a passive or active device on the die and is used to carry a signal. A power conductive bump provides a power supply voltage to the die. A mechanical conductive bump is electrically isolated with respect to the die that it is formed on, and may be introduced to meet a minimum bump density requirement.

Illustrated in FIG. 2 are three zones on the bottom of the second tier die 108: an outer zone 202, an inner zone 204, and an intermediate zone 206. Each of the conductive bumps labeled 114 in FIGS. 1 and 2 lie in the inner zone 204. The two conductive bumps in FIG. 1 labeled 116 lie in the outer zone 202, where an example of such a conductive bump in FIG. 2 is labeled 116. All of the signal and power conductive bumps for the second tier die 108 lie in the inner zone 204. There may be substrate and mechanical conductive bumps in the inner zone 204. There also may be substrate and mechanical conductive bumps in the intermediate zone 206, but for the particular embodiment illustrated in FIGS. 1 and 2, there are no conductive bumps in the intermediate zone 206. The outer zone 202 comprises substrate conductive bumps. For some embodiments, the outer zone 202 may also comprise mechanical conductive bumps.

Figure 3:
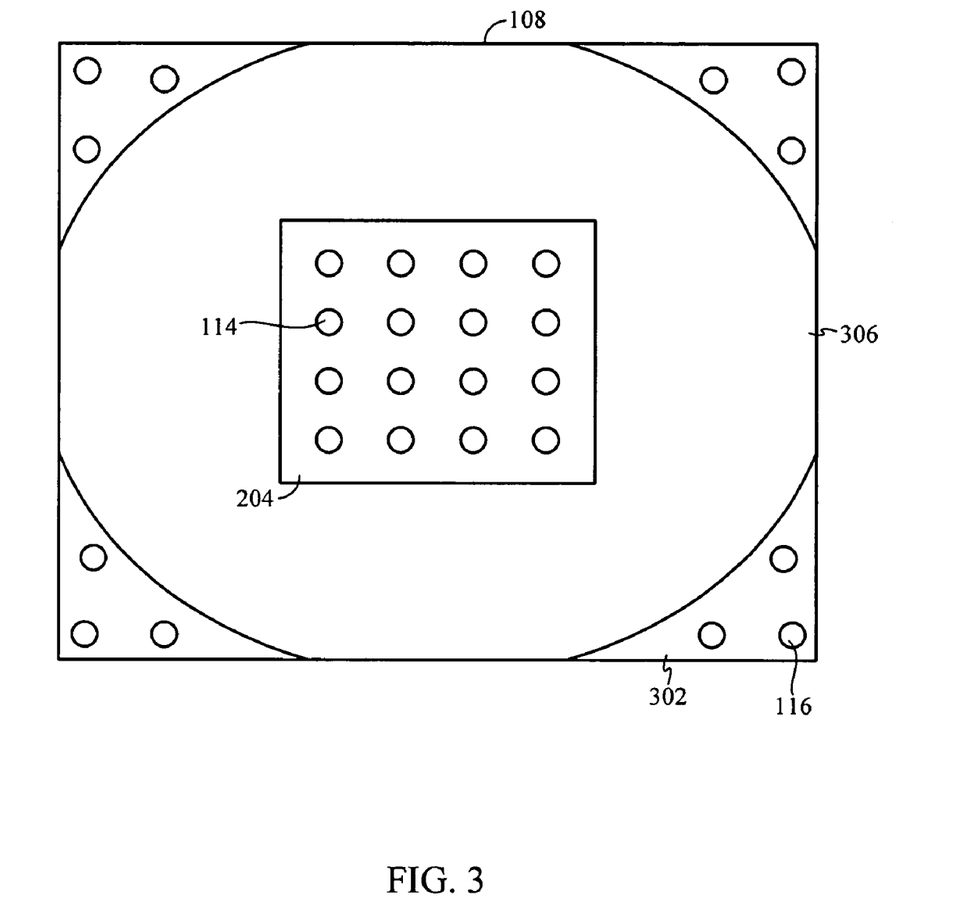

For the particular embodiment illustrated in FIG. 2, the zones are shown as having perimeters comprising straight lines meeting at right angles; and the inner, intermediate, and outer zones are illustrated as contiguous regions. However, no particular shape for a zone is required, and some of these zones need not be contiguous. For example, the intermediate zone 206 may be stretched so as to separate the outer zone 202 into four sub-zones, where each sub-zone is a contiguous region. Such an example is illustrated in FIG. 3, where because of the shape of the intermediate zone 306, the outer zone 302 comprises four sub-zones, each a contiguous zone.

The outer zone 202 contains the perimeter of surface of the die 108. Although the outer zone 302 comprises four sub-zones, the outer zone 302 may nevertheless be considered as containing the perimeter of the surface of the die 108, just as for the outer zone 202, where portions of the outer zone 302 may be considered as having zero area. These portions zero area are where the inner and outer boundaries of the outer zone come together. In both of the embodiments of FIGS. 2 and 3, it is seen that the intermediate zones and the outer zones share a boundary. That is, for an embodiment, the inner boundary of the outer zone is coincident with the outer boundary of the intermediate zone. Similarly, the inner zone and the intermediate zone for each embodiment share a boundary. For an embodiment, the inner zone and the intermediate zone are each contiguous regions. The union of the inner, intermediate, and outer zones makes up the entire surface.

For the conductive bumps on the bottom side 112 of the second tier die 108, there are corresponding conductive bumps on the top side of the first tier die 102. That is, for some particular conductive bump on the bottom side of the second tier die 108, the conductive bump on the first tier die 102 corresponding to that particular conductive bump is the one that makes contact with it as the two dice are brought together for attachment and bonding. As a result, the top side of the first tier die 102 may be viewed as having zones that correspond to the zones of the second tier die 108.

However, the outer zone 202 may not necessarily correspond to the outer dimensions of the first tier die 102. For example, the first tier die 102 may have a larger surface area than the second tier die 108. As another example, the first tier die 102 may be designed to have two or more second tier dice stacked on it, so that the first tier die 102 may comprise a much larger number of conductive bumps than those that correspond to the conductive bumps on the second tier die 108. Some of the conductive bumps on the top side of the first tier die 102 may not lie in any of the zones that correspond to the zones illustrated in FIG. 2. Nevertheless, it may still be useful to refer to the zone on the first tier die 102 that corresponds to the outer zone 202 as an "outer zone". Similarly, the zones on the first tier die 102 corresponding to the intermediate zone 206 and the inner zone 204 may also be referred to, respectively, as an "intermediate zone" and an "inner zone". With the outer zone of the first tier die 102 so defined, the conductive bumps on the outer zone of the first tier die 102 are electrically coupled to the substrate of the first tier die 102, and so they may also be termed $V_{SS}$ conductive bumps.

Figure 4:
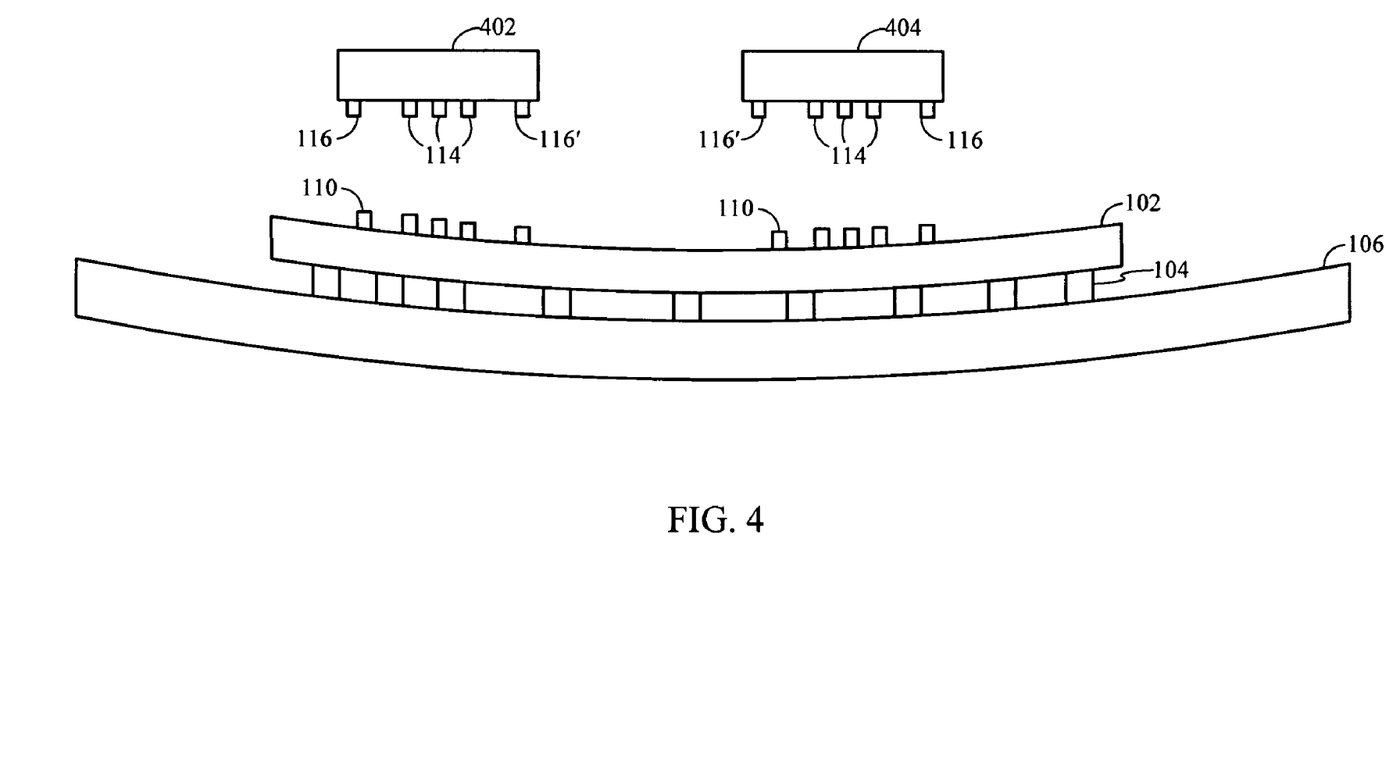
FIG. 4 illustrates a cross-sectional view of a second tier die and a warped first tier die before contact is made.

FIG. 4 illustrates an embodiment in which there are two second tier dice, labeled 402 and 404. The same numeric labeling for the conductive bumps, first tier die, and the package substrate used in FIG. 1 is also used in FIG. 2, with the exception that the Vss conductive bumps on the second tier dice towards the center of the first tier die 102 in FIG. 4 are labeled 116'. The $V_{SS}$ conductive bumps 116 make contact with their corresponding $V_{SS}$ conductive bumps 110 before the $V_{SS}$ conductive bumps 116'; and depending upon the degree of warping and the size of bumps, some of the inner zone conductive bumps 114 may come into contact with their corresponding bumps on the first tier die 102 before the $V_{SS}$ conductive bumps 116'.

Because of the warping of the first tier die 102, the position and shape of the zones may be designed such that all, or at least some, of the conductive bumps formed on the outer zone 202 come into contact with their corresponding conductive bumps on the top side of the first tier die 102 before any of the conductive bumps formed on the inner zone 204 come into contact with their corresponding conductive bumps as the two dice are brought together for attachment and bonding. It is possible that some of the conductive bumps, if any, formed in the intermediate zone 206 may also come into contact with some of their corresponding conductive bumps before all of the outer zone 206 $V_{SS}$ conductive bumps have come into contact with their corresponding conductive bumps. In this regard, the intermediate zone 206 serves as a safety margin to ensure that none of the inner zone 204 conductive bumps come into contact with their corresponding conductive bumps until at least some of the outer zone 202 conductive bumps have made contact with their corresponding conductive bumps.

As an example of a safety margin introduced by the intermediate zone 206, let x denote the distance from the center of the second tier die 108 to its edge, and suppose the first tier die 102 warping introduces a 20 μm differential in height over the lateral distance x. For purposes of this example, suppose that the shapes of the zones are square as indicated in FIG. 2, and that the direction in which x is taken is parallel to a side of one of the illustrated squares. (That is, the direction in which the distance x is taken may be horizontal or vertical with respect to the illustration of FIG. 2.) Also, suppose the sides of the inner zone 204, which correspond to the inner sides of the intermediate zone 206, extend to perpendicular distance x/4 relative to the center of the die 108, and that the outer sides of the intermediate zone 206 extend to a perpendicular distance 3x/4 relative to the center of the die 108. Then for the case in which the warping is linear, the minimum height difference between the inner and outer zones is 10 μm. In practice, the warping is not linear and would introduce a greater height difference, so that 10 μm is a lower bound, and serves as a conservative estimate when calculating the safety margin introduced by the intermediate zone 206.

There may also be a height difference introduced in the bumps by using two lithography masks so that the bumps in the outer zone 202 have a greater height than the bumps in the inner zone 204. For example, a differential bump height of 5 μm may be introduced. Assuming a 20% range of bump heights due to process variation, the difference in the distance of the bumps in the outer zone 202 and the distance of the bumps in the inner zone 204 (assuming that the die 108 is not warped) is conservatively given by 4.5 μm+10 μm=14.5 μm. Thus, for this particular example, there will be a distance of about 14.5 μm between the bumps in the inner zone 204 of the second tier die 108 and their corresponding bumps or pads on the first tier die 102 when the bumps in the outer zone 202 of the second tier die 108 first make contact with their corresponding bumps or pads on the first tier die 102 as a pick and place tool moves the second tier die 108 to the first tier die 102.

In the particular embodiment of FIG. 1, the warping of the first tier die 102 and the substrate 106 is such that they are concave with respect to the second tier die 108. The warping may depend upon the coefficients of thermal expansion of the substrate 106 and the die 102. It is possible for some embodiments that the warping of the die 102 and the substrate 106 may be such that they are convex with respect to the die 108. For such embodiments, the roles of the inner zone 204 and the outer zone 202 are reversed because the inner zone 204 conductive bumps will come into contact with their corresponding conductive bumps on the first tier die 102 before the outer zone 202 conductive bumps make contact with their corresponding conductive bumps. Accordingly, for such embodiments, all of the signal and power conductive bumps for the second tier die 108 lie in the outer zone 202. There may be substrate and mechanical conductive bumps in the outer zone 202. The inner zone 204 comprises substrate conductive bumps. For some embodiments, the inner zone 204 may also comprise mechanical conductive bumps.

Because all or some of the $V_{SS}$ conductive bumps in the outer zone 202 make electrical contact with their corresponding $V_{SS}$ conductive bumps on the first tier die 102 before the power and signal conductive bumps on the second tier die 108 make contact with their corresponding power in signal conductive bumps on the first tier die 102 as the two dice are brought together, there is a preferential path for charge sharing between the substrates of the first tier and second tier dice. Because this preferential path is from one substrate to the other, it is expected that embodiments may mitigate ESD damage.

Once the first tier and second tier dice have come into contact with each other, and after compression bonding has been completed, it is expected that the warping illustrated in FIG. 1 will essentially disappear as the temperature is brought down, as is expected for ordinary fabrication of through-silicon stacking integrated circuit packaging.

Figure 5:
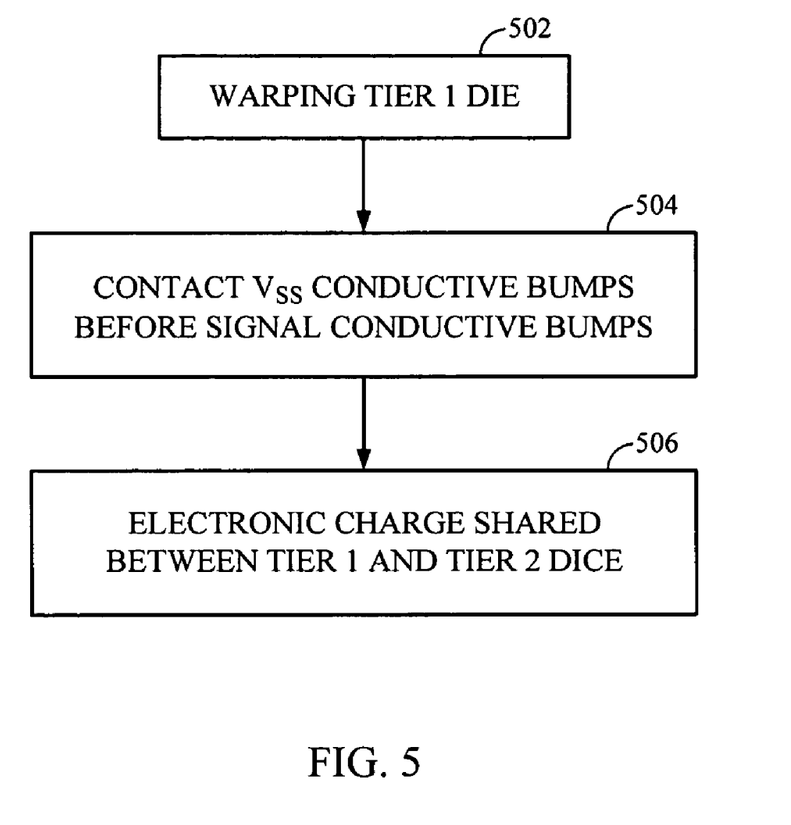
FIG. 5 illustrates a flow diagram.

FIG. 5 is a flow diagram according to the above description, where in box 502 a first tier die is warped by high temperature, in box 504 a second tier die is placed in contact with the first tier so that $V_{SS}$ conductive bumps on the two dice make contact before the signal conductive bumps make contact, and in box 506 electronic charge is shared between the substrates of the two dice. Of course, if the potential difference between the two substrates is zero or insignificant before the two dice are brought together, then little or no electronic charge would be shared, so that the activity in box 306 may be insubstantial some of the time.

Figure 6:
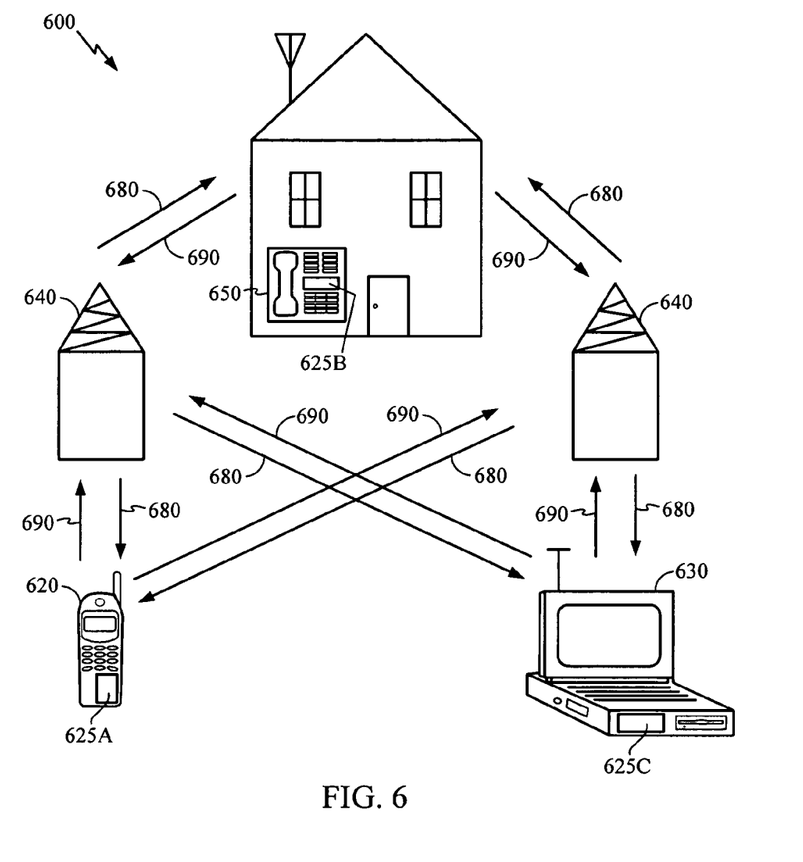
FIG. 6 illustrates one or more communication systems employing an embodiment.

FIG. 6 is a diagram illustrating a wireless communication system. In some embodiments, a system 600 includes multiple remote units 620-624, and multiple base stations 650-652. It can be recognized that typical wireless communication systems may have many more remote units and base stations. The remote units 620-624 include multiple semiconductor devices 630-634 having an integrated circuit package comprising the first and second tier dice as described in these letters patent. FIG. 6 shows a forward link signal 680 from the base stations 650-652 and the remote units 620-624, and a reverse link signal 690 from the remote units 620-624 to the base stations 650-652.

In other embodiments, in FIG. 6 the remote unit 620 is shown as a mobile telephone, the remote unit 622 is shown as a portable computer, and the remote unit 624 is shown as a fixed location remote unit in a wireless local loop system. For example, the remote units may be mobile phones, hand-held personal communication systems (PCS) units, portable data units such as personal data assistants, navigation devices (e.g., GPS enabled devices) set-top boxes, music players, video players, entertainment units, fixed location data units such as meter reading equipment, or any other device that stores or retrieves data or computer instructions, or any combination thereof. Although FIG. 6 illustrates remote units according to the teachings of the disclosure, the disclosure is not limited to these illustrated units.

Various modifications may be made to the disclosed embodiments without departing from the scope of the invention as claimed below.

What is claimed is:

1. A method comprising:
   warping a first tier die, the first tier die having a substrate, a set of signal conductive bumps and power conductive bumps not electrically connected to the first tier die substrate, and a set of substrate conductive bumps each electrically connected to the first tier die substrate; and
   placing a second tier die in electrical contact with the first tier die; the second tier die having a substrate, a set of signal conductive bumps and power conductive bumps not electrically connected to the second tier die substrate, and a set of substrate conductive bumps each electrically connected to the second tier die substrate;
   wherein when placing the second tier die in contact with the first tier die, the second tier die set of substrate conductive bumps makes contact with the first tier die set of substrate conductive bumps before the second tier die set of signal conductive bumps and power conductive bumps makes contact with the first tier die set of signal conductive bumps and power conductive bumps.

2. The method as set forth in claim 1, the first tier die comprising a second set of substrate conductive bumps each electrically connected to the first tier die substrate, and the second tier die comprising a second set of substrate conductive bumps each electrically connected to the second tier die substrate, wherein when placing the second tier die in contact with the first tier die, the second tier die set of signal conductive bumps and power conductive bumps makes contact with the first tier die set of signal conductive bumps and power conductive bumps before the second tier die second set of substrate conductive bumps makes contact with the first tier die second set of substrate conductive bumps.

3. The method as set forth in claim 1, the second tier die having a surface with a perimeter, wherein the second tier die substrate conductive bumps are formed in an outer zone of the second tier die surface, wherein the outer zone contains the perimeter.

4. The method as set forth in claim 3, wherein the second tier die signal conductive bumps and power conductive bumps are formed in an inner zone of the second tier die surface, wherein the outer zone surrounds the inner zone.

5. The method as set forth in claim 1, further comprising sharing electronic charge between the first tier die substrate and the second tier die substrate by way of the first tier die set of substrate conductive bumps and the second tier die set of substrate conductive bumps.

6. The method as set forth in claim 1, the second tier die having a surface with a perimeter, wherein the second tier die substrate conductive bumps are formed in an inner zone of the second tier die surface, where the inner zone does not contain any of the perimeter.

7. The method as set forth in claim 6, wherein the second tier die signal conductive bumps and power conductive bumps are formed in an outer zone of the second tier die surface, wherein the outer zone contains the perimeter.

8. A system comprising an integrated circuit package comprising:
   a first die comprising a first substrate and a first surface, the first surface having a perimeter and comprising: a first outer zone of conductive bumps, the first outer zone containing the perimeter and having an inner boundary, wherein at least some of the first outer zone of conductive bumps are electrically coupled to the first substrate and none are signal conductive bumps or power conductive bumps; a first intermediate zone contiguous and having an outer boundary coincident with the inner boundary of the first outer zone, having no signal conductive bumps or power conductive bumps, having an inner boundary; a first inner zone of conductive bumps, the first inner zone contiguous and having a boundary coincident with the inner boundary of the first intermediate zone; wherein the union of the first outer zone, the first intermediate zone, and the first inner zone comprises the first surface; and
   a second die comprising a second substrate and a second surface, the second surface comprising: a second outer zone of conductive bumps corresponding to the first outer zone of conductive bumps, wherein at least some of the second outer zone of conductive bumps are electrically coupled to the second substrate and none are signal conductive bumps or power conductive bumps; a second intermediate zone corresponding to the first intermediate zone and not having signal conductive bumps or power conductive bumps; and a second inner zone of conductive bumps corresponding to the first inner zone of conductive bumps;
   wherein the conductive bumps in the first outer zone are electrically coupled to their corresponding conductive bumps in the second outer zone, and the conductive bumps in the first inner zone are electrically coupled to their corresponding conductive bumps in the second inner zone.

9. The integrated circuit package as set forth in claim 8, wherein the first and second outer zones of conductive bumps are configured to come into contact with each other before the first and second inner zones of conductive bumps come into contact with each other as the first and second dice are placed into contact with each other.

10. The integrated circuit package as set forth in claim 8, wherein each of the conductive bumps in the first outer zone are electrically coupled to the first substrate, and each of the conductive bumps in the second outer zone are electrically coupled to the second substrate.

11. The integrated circuit package as set forth in claim 8, the first intermediate zone comprising conductive bumps electrically isolated from the first die.

12. The system as set forth in claim 8, further comprising a device selected from the group consisting of a set top box, a music player, a video player, an entertainment unit, a navigation device, a communications device, a personal digital assistant (PDA), a fixed location data unit, and a computer; wherein the integrated circuit package is integrated into the device.

13. A system comprising an integrated circuit package comprising:
   a first die comprising a first substrate and a first surface, the first surface having a perimeter and comprising: a first outer zone of conductive bumps, the first outer zone containing the perimeter and having an inner boundary; a first intermediate zone contiguous and having an outer boundary coincident with the inner boundary of the first outer zone, having no signal conductive bumps or power conductive bumps, and having an inner boundary; a first inner zone contiguous and having an outer boundary coincident with the inner boundary of the first intermediate zone, wherein at least some of the first inner zone of conductive bumps are electrically coupled to the first substrate and none are signal conductive bumps or power conductive bumps; wherein the union of the first outer zone, the first intermediate zone, and the first inner zone comprises the first surface; and a second die comprising a second substrate and a second surface, the second surface comprising: a second outer zone of conductive bumps corresponding to the first outer zone of conductive bumps; a second intermediate zone corresponding to the first intermediate zone and not having signal conductive bumps or power conductive bumps;

and a second inner zone of conductive bumps corresponding to the first inner zone of conductive bumps wherein at least some of the second inner zone of conductive bumps are electrically coupled to the second substrate and none are signal conductive bumps or power conductive bumps;

wherein the conductive bumps in the first outer zone are electrically coupled to their corresponding conductive bumps in the second outer zone, the conductive bumps in the first inner zone are electrically coupled to their corresponding conductive bumps in the second inner zone.

14. The integrated circuit package as set forth in claim 13, wherein each of the conductive bumps in the first inner zone are electrically coupled to the first substrate, and each of the conductive bumps in the second inner zone are electrically coupled to the second substrate.

15. The integrated circuit package as set forth in claim 13, the first intermediate zone comprising conductive bumps electrically isolated from the first die.

16. The system as set forth in claim 13, further comprising a device selected from the group consisting of a set top box, a music player, a video player, an entertainment unit, a navigation device, a communications device, a personal digital assistant (PDA), a fixed location data unit, and a computer; wherein the integrated circuit package is integrated into the device.

17. A method comprising:
means for warping a first tier die, the first tier die having a substrate, a set of signal conductive bumps and power conductive bumps not electrically connected to the first tier die substrate, and a set of substrate conductive bumps each electrically connected to the first tier die substrate; and means for placing a second tier die in electrical contact with the first tier die; the second tier die having a substrate, a set of signal conductive bumps and power conductive bumps not electrically connected to the second tier die substrate, and a set of substrate conductive bumps each electrically connected to the second tier die substrate;

wherein when placing the second tier die in contact with the first tier die, the second tier die set of substrate conductive bumps makes contact with the first tier die set of substrate conductive bumps before the second tier die set of signal conductive bumps and power conductive bumps makes contact with the first tier die set of signal conductive bumps and power conductive bumps.

18. The method as set forth in claim 17, the first tier die comprising a second set of substrate conductive bumps each electrically connected to the first tier die substrate, and the second tier die comprising a second set of substrate conductive bumps each electrically connected to the second tier die substrate, wherein when placing the second tier die in contact with the first tier die, the second tier die set of signal conductive bumps and power conductive bumps makes contact with the first tier die set of signal conductive bumps and power conductive bumps before the second tier die second set of substrate conductive bumps makes contact with the first tier die second set of substrate conductive bumps.

19. The method as set forth in claim 17, the second tier die having a surface with a perimeter, wherein the second tier die substrate conductive bumps are formed in an outer zone of the second tier die surface, wherein the outer zone contains the perimeter.

20. The method as set forth in claim 19, wherein the second tier die signal conductive bumps and power conductive bumps are formed in an inner zone of the second tier die surface, wherein the outer zone surrounds the inner zone.

21. The method as set forth in claim 17, further comprising means for sharing electronic charge between the first tier die substrate and the second tier die substrate by way of the first tier die set of substrate conductive bumps and the second tier die set of substrate conductive bumps.

22. The method as set forth in claim 17, the second tier die having a surface with a perimeter, wherein the second tier die substrate conductive bumps are formed in an inner zone of the second tier die surface, where the inner zone does not contain any of the perimeter.

23. The method as set forth in claim 22, wherein the second tier die signal conductive bumps and power conductive bumps are formed in an outer zone of the second tier die surface, wherein the outer zone contains the perimeter.

24. A system comprising an integrated circuit package comprising:
a first die comprising a first substrate and a first surface, the first surface having a perimeter and comprising: a first outer zone of conductive bumps, the first outer zone containing the perimeter and having an inner boundary; means for coupling at least some of the first outer zone of conductive bumps to the first substrate, wherein none are signal conductive bumps or power conductive bumps; a first intermediate zone contiguous and having an outer boundary coincident with the inner boundary of the first outer zone, having no signal conductive bumps or power conductive bumps, having an inner boundary; a first inner zone of conductive bumps, the first inner zone contiguous and having a boundary coincident with the inner boundary of the first intermediate zone; wherein the union of the first outer zone, the first intermediate zone, and the first inner zone comprises the first surface;

a second die comprising a second substrate and a second surface, the second surface comprising: a second outer zone of conductive bumps corresponding to the first outer zone of conductive bumps; means for electrically coupling at least some of the second outer zone of conductive bumps to the second substrate, wherein none are signal conductive bumps or power conductive bumps; a second intermediate zone corresponding to the first intermediate zone and not having signal conductive bumps or power conductive bumps; and a second inner zone of conductive bumps corresponding to the first inner zone of conductive bumps;

means for electrically coupling the conductive bumps in the first outer zone to their corresponding conductive bumps in the second outer zone; and means for electrically coupling the conductive bumps in the first inner zone to their corresponding conductive bumps in the second inner zone.

25. The integrated circuit package as set forth in claim 24, wherein the first and second outer zones of conductive bumps are configured to come into contact with each other before the first and second inner zones of conductive bumps come into contact with each other as the first and second dice are placed into contact with each other.

26. The integrated circuit package as set forth in claim 24, further comprising means for electrically coupling each of the conductive bumps in the first outer zone to the first substrate; and means for electrically coupling each of the conductive bumps in the second outer zone to the second substrate.

27. The integrated circuit package as set forth in claim 24, the first intermediate zone comprising conductive bumps electrically isolated from the first die.

28. The system as set forth in claim 24, further comprising a device selected from the group consisting of a set top box, a music player, a video player, an entertainment unit, a navigation device, a communications device, a personal digital assistant (PDA), a fixed location data unit, and a computer; wherein the integrated circuit package is integrated into the device.

\* \* \* \* \*